United States Patent [19]  [11] Patent Number: 5,872,055
Jenq et al.  [45] Date of Patent: Feb. 16, 1999

[54] METHOD FOR FABRICATING POLYSILICON CONDUCTING WIRES

[75] Inventors: Jason Jenq, Pingtung; Sun-Chieh Chien, Hsinchu, both of Taiwan

[73] Assignee: United Microelectronics Corporation, Taiwan

[21] Appl. No.: 768,971

[22] Filed: Dec. 18, 1996

[30] Foreign Application Priority Data

Oct. 23, 1996 [TW] Taiwan ................... 85113013

[51] Int. Cl.$^6$ .......... H01L 21/306; H01L 21/311
[52] U.S. Cl. .......... 438/636; 438/657; 438/757
[58] Field of Search ................... 438/585, 591, 438/592, 636, 657, 756, 757, 952, 346

[56] References Cited

U.S. PATENT DOCUMENTS

| | | | |
|---|---|---|---|
| 4,933,304 | 6/1990 | Chen et al. | 438/636 |
| 4,971,655 | 11/1990 | Stefano et al. | 438/592 |
| 5,166,093 | 11/1992 | Grief | 438/636 |
| 5,604,157 | 2/1997 | Dai et al. | 437/200 |

*Primary Examiner*—John F. Niebling
*Assistant Examiner*—Ha Tran Nguyen
*Attorney, Agent, or Firm*—Rabin & Champagne, P.C.

[57] ABSTRACT

A manufacturing method of fabricating a polysilicon conductive wire suitable for an integrated circuit and which can avoid pattern transfer errors caused by reflection of ultraviolet light during photolithographic processing and that results in constriction in width or the bottlenecking effect in part of the conductive wore. A polysilicon layer is formed above a semiconductor substrate having a preformed device. A cap insulting layer is formed above the polysilicon layer. A micro-roughness structure is formed on the surface of the cap insulating layer. A photoresist layer is coated over the micro-roughened surface of the cap insulating layer. A pattern is transferred onto the photoresist layer by selective light exposure followed by the removal of unexposed photoresist. Then the cap insulating layer and the polysilicon layer are etched in sequence in regions not covered by photoresist. The residual photoresist is then removed to leave behind a polysilicon conductive wire.

19 Claims, 7 Drawing Sheets

METHOD FOR FABRICATING POLYSILICON CONDUCTING WIRES

BACKGROUND OF THE INVENTION

1. Field of the Invention

The invention relates in general to the manufacturing of integrated circuits, and more particularly to a method of eliminating light reflection during exposure in photolithographic processing so as to prevent the occurrence of a bottle necking effect in polysilicon wires caused by a non-uniform thickness of a field oxide layer near its peripheral transition regions.

2. Description of the Related Art

Photolithography is an important procedure in the manufacture of semiconductors. Patterning on each thin film layer and on regions to which various impurities are applied, are generally defined using photolithographic techniques. Basically, photolithographic processing is begun by coating a layer of photosensitive material, commonly called photoresist, on the surface of a silicon wafer. Then, using a parallel light source, light is passed through a mask with a predefined pattern such that the photosensitive material is selectively exposed, thereby to transfer the pattern on the mask onto the photosensitive material. After that, the photo-reacted layer is developed and prepared for subsequent operations. In order to increase the resolution of the pattern, deep ultraviolet light (DUV) has recently been used as the light source. However, due to the comparatively shorter wavelength of the light, the effect of light reflection becomes more dominant, and as a result leads to more obvious pattern transfer errors and subsequent etching misalignments. An example is a caving-in along a portion of the line width of a polysilicon conductive wire, forming a so-called bottleneck.

In the manufacture of a dynamic random access memory (DRAM), due to a self-aligned contact window requirement, a cap layer composed of silicon dioxide or silicon nitride material is usually formed above a polysilicon layer to prevent short-circuiting between two neighboring polysilicon layers. When the level of integration is increased and the component dimensions are correspondingly reduced, for example, when the line width is smaller than 0.45 $\mu$m the bottlenecking effect in the polysilicon conductive wire that occurs near the peripheral transition region of the field oxide layer due to light source reflection, becomes especially serious.

To better understand the pattern transfer errors generated by DUV light reflections, which result in the bottlenecking effect, an example illustrating the conventional method of forming a polysilicon conductive wire over a DRAM is given below.

FIGS. 1A through 1E are cross-sectional, perspective, and top views illustrating the steps of a conventional method of manufacturing a polysilicon conductive wire in a DRAM unit.

Figure 1A:
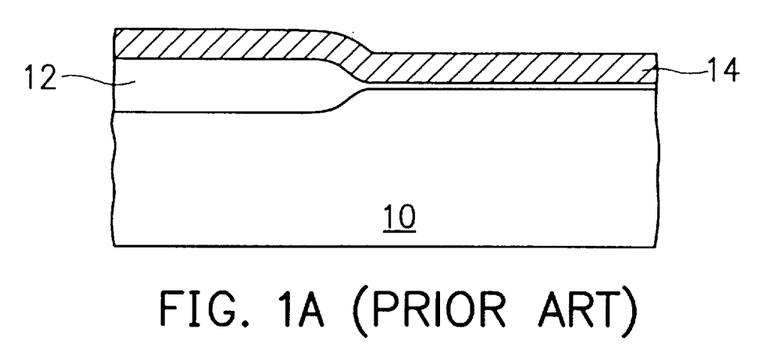
FIGS. 1A through 1C are cross-sectional views showing successive steps of a conventional method of manufacturing a polysilicon conductive wire in a DRAM unit.

First, referring to FIG. 1A, a field oxide layer 12 for isolating a component as well as a necessary device (not shown in the Figure), are formed on a silicon substrate 10. Then, a polysilicon layer 14 is formed over the silicon substrate 10.

Figure 1B:
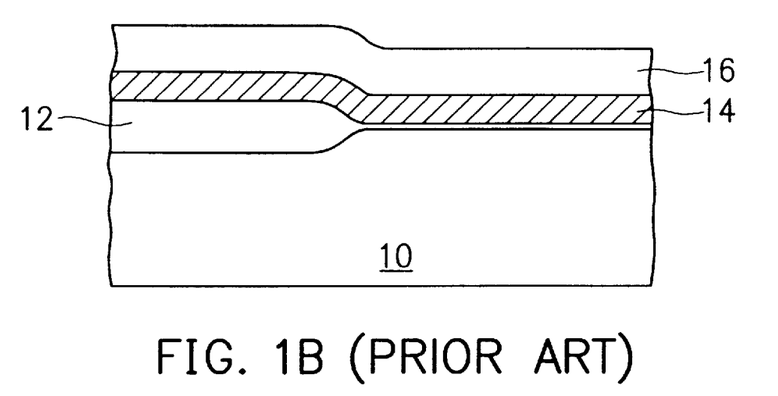

Referring next to FIG. 1B, a cap oxide layer 16 is formed above the polysilicon layer 14.

Figure 1C:
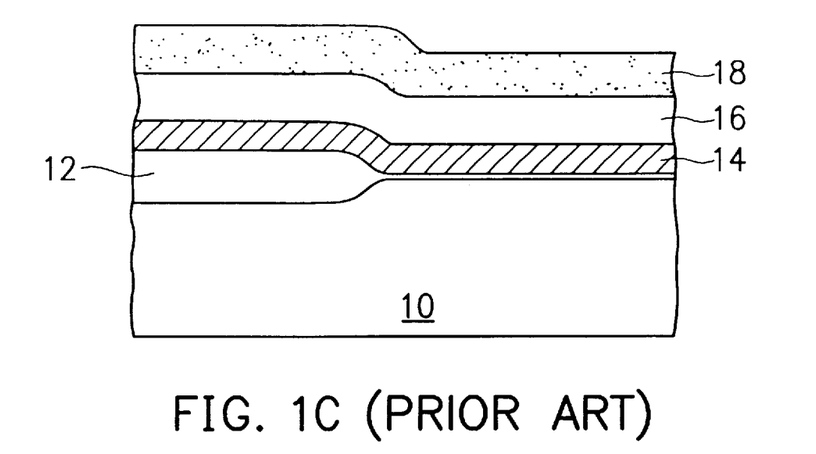

Referring next to FIG. 1C, the cap oxide layer 16 is coated with a photoresist layer 18.

Figure 1D:
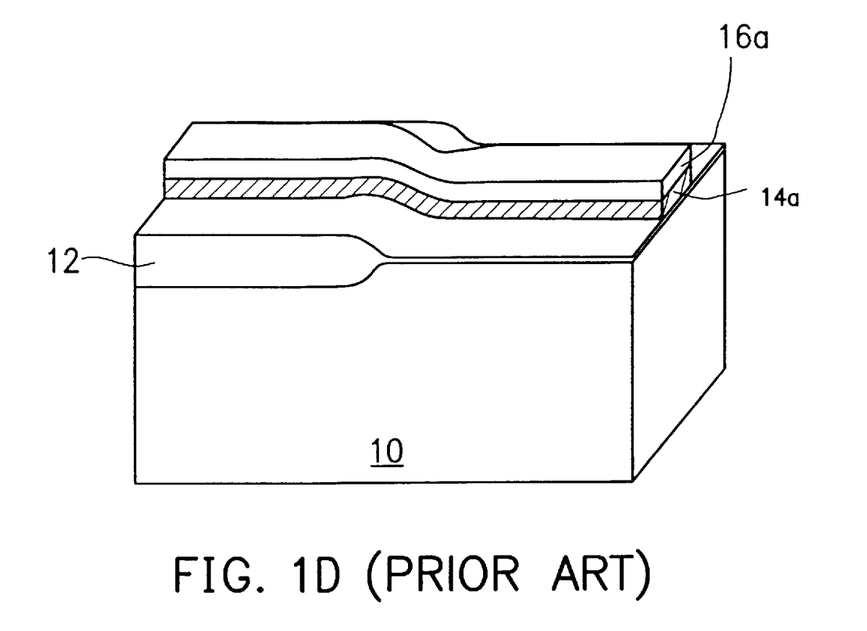
FIG. 1D is a perspective view showing the result of subsequent processing after the polysilicon conductive wire of FIG. 1C is formed.
Figure 1E:
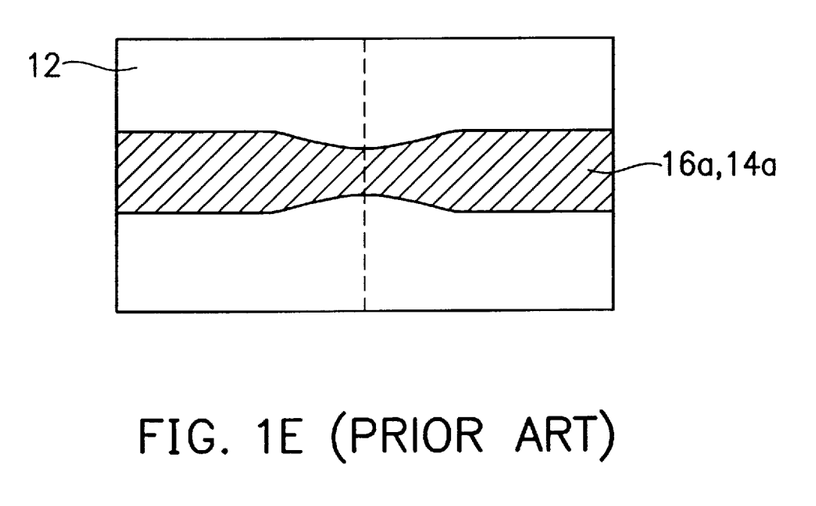
FIG. 1E is the top view of the structure shown in FIG. 1D.

Lastly, reference is made to FIG. 1D and 1E, which are perspective and top views of a structure formed after the application of photolithographic and etching processes to the structure shown in FIG. 1C. Using a parallel light source, such as a parallel source of DUV, light is passed through a patterned mask so that the pattern is transferred to the photoresist layer 18. Then, after development and partial removal of the photoresist layer 18, subsequent etching is performed which is targeted on regions without photoresist coverage. Consequently the cap oxide layer 16 and the polysilicon layer 14 are etched in sequence respectfully to form an etched cap oxide layer 16a and an etched polysilicon layer 14a. Finally, a double-layered composite structure of the cap oxide layer 16a and the etched polysilicon conducting wire 14a are formed upon removal of the residual photoresist layer 18.

In the aforementioned method of manufacturing polysilicon conductive wires in a DRAM unit, because of a difference in height the cap oxide layer running above the field oxide layer and crossing its peripheral transition region, ultraviolet light used in the selective exposure of the photoresist layer undergoes reflection upon reaching the surface of the cap oxide layer. This affects the photoresist layer below the supposed dark regions of the mask, and thus results in pattern transfer errors. Therefore, the etching performed thereafter leads to a partial over taking that results in a bottleneck structure in the wiring (polysilicon conductive wires).

Two conventional methods for reducing the bottlenecking effect caused by light reflection are generally used, namely:

(1) applying a top anti-reflection coating (T-ARC) above the photoresist layer; and (2) applying a bottom anti-reflection coating (B-ARC) before the application of the photoresist layer. Moreover, the first of these methods can be used for the prevention of the bottlenecking effect on specific locations only, and moreover its effectiveness is poor. Moreover, while the second of these methods can have the desirable effects, the repeatability of its etching process is poor, and the operation is hard to control. Further, the second method can cause formation of impurity particles that can severely affect the properties of the resulting device.

SUMMARY OF THE INVENTION

It is therefore an object of the invention to provide a method for manufacturing polysilicon conductive wires, which both avoids the problem of pattern transfer errors and subsequent bottlenecking in some part of the wiring through the elimination of ultraviolet light reflection, and prevents the generation of impurity particles while providing a better processing repeatability.

According to the objects stated above, the invention provides a method for manufacturing polysilicon conductive wires suitable for use in the fabrication of DRAM integrated circuits. According to the method, a polysilicon layer is formed above a semiconductor substrate having a preformed DRAM device. A cap insulating layer is formed above the polysilicon layer. A structure providing micro-roughness is then provided on the surface of the cap insulating layer. A photoresist layer is coated over the micro-roughened surface of the cap insulating layer. A pattern is then transferred onto the photoresist layer by selective exposure followed by the removal of unexposed portions of the photoresist layer. The cap insulating layer and the polysilicon layer are etched in sequence in those regions without photoresist coverage. Next, the residual photoresist layer is removed, leaving behind a polysilicon conductive wire.

According to the objects stated above, the invention also provides a method for manufacturing polysilicon conductive wires suitable for use in the fabrication of integrated circuits, wherein a field oxide layer and a necessary device are formed on a semiconductor substrate. A polysilicon layer is then formed over the semiconductor substrate, a cap oxide layer is formed over the polysilicon layer, and a silicon nitride layer is formed over the cap oxide layer. An etchant then is used to wet-etch the cap oxide layer from the surface of the silicon nitride layer, so as to form a micro-roughened surface structure. Next, a photoresist layer is coated over the already micro-roughened surface of the cap oxide layer. Subsequently, a pattern is transferred to the photoresist layer by selective exposure, followed by removal of an unexposed photoresist layer. The cap insulating layer and the polysilicon layer are then etched, in sequence, in those regions without photoresist coverage. The residual photoresist layer is then removed to leave behind a polysilicon conductive wire.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 2A through 2G are cross-sectional, perspective and top views showing a manufacturing flow of a polysilicon conductive wire in a DRAM unit according to the invention.

Figure 2A:
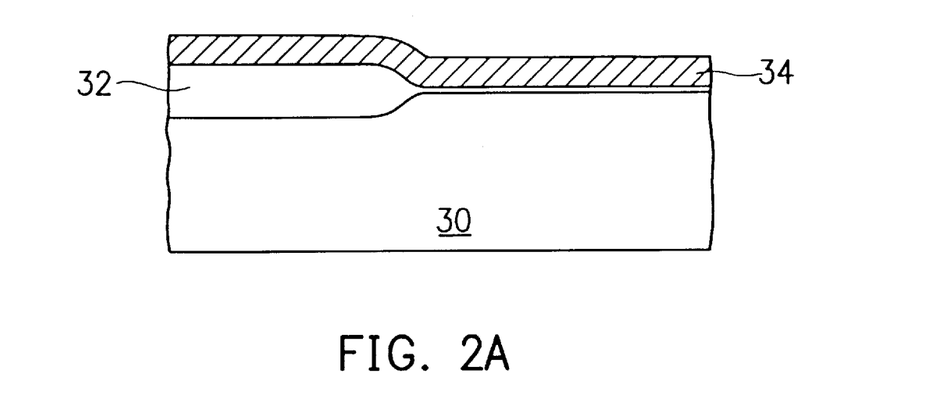
FIG. 2A through 2E are cross-sectional views showing successive steps of a method of manufacturing according to one preferred embodiment of the invention.

First, referring to FIG. 2A, according to an embodiment of the invention, on a semiconductor substrate 30 such as a silicon substrate having a field oxide layer 32 and a necessary DRAM device (not shown in the Figure), a layer of polysilicon 34 is formed using, for example, chemical vapor deposition (CVD), and deposited to a thickness of approximately 1000 Å to 1500 Å. Then, a layer of metal silicide $WSi_x$ (not shown in the Figure) with a thickness of approximately 1500 Å to 1800 Å can be added on top of the polysilicon layer to increase the latter's electrical conductivity.

Figure 2B:
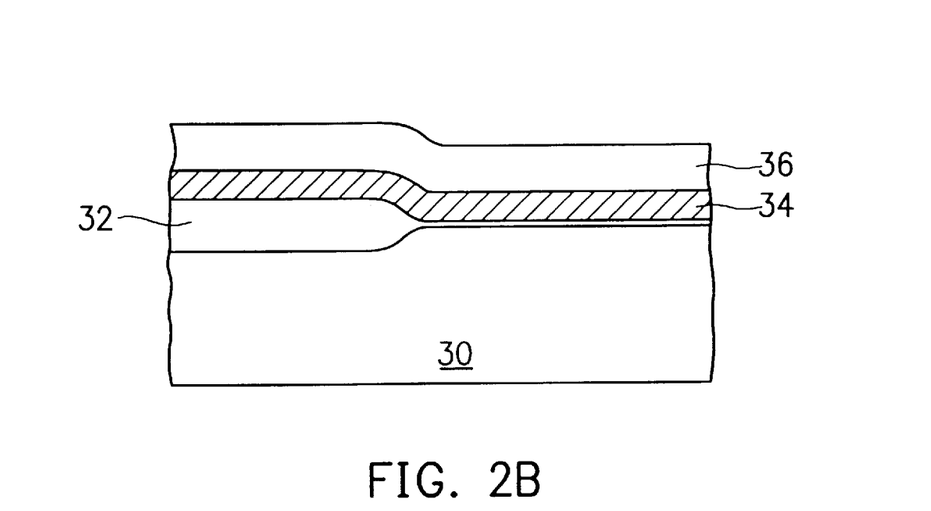

Referring next to FIG. 2B, in the subsequent step a cap insulating layer 36 is formed over the polysilicon layer 34, for example, using low pressure chemical vapor deposition (LPCVD) or plasma enhanced chemical vapor deposition (PECVD) with tetraethoxysilane (TEOS) as the reactive gas and depositing the oxide layer to a thickness of between 2500 Å and 3000 Å. Obviously, other deposition techniques methods and use of equivalent insulating materials that can meet the demand of the manufacturing process, can also be substituted for the method explained in this embodiment. However, in this embodiment, a cap oxide layer is used as an example throughout subsequent processing steps described below.

Figure 2C:
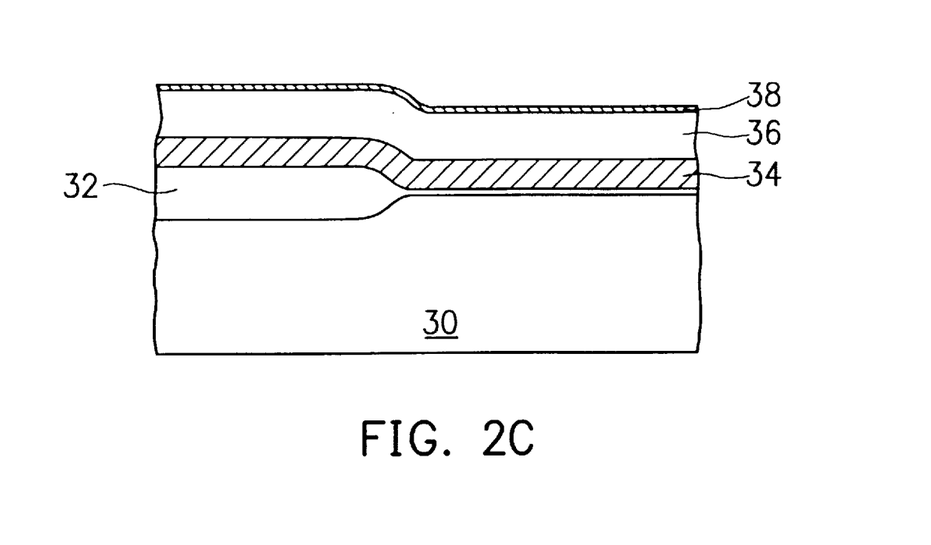

Referring to FIG. 2C, a silicon nitride layer 38 is formed on the cap oxide layer. A thickness of the silicon nitride layer 38 can be, for example, between about 60 Å and 300 Å.

Figure 2D:
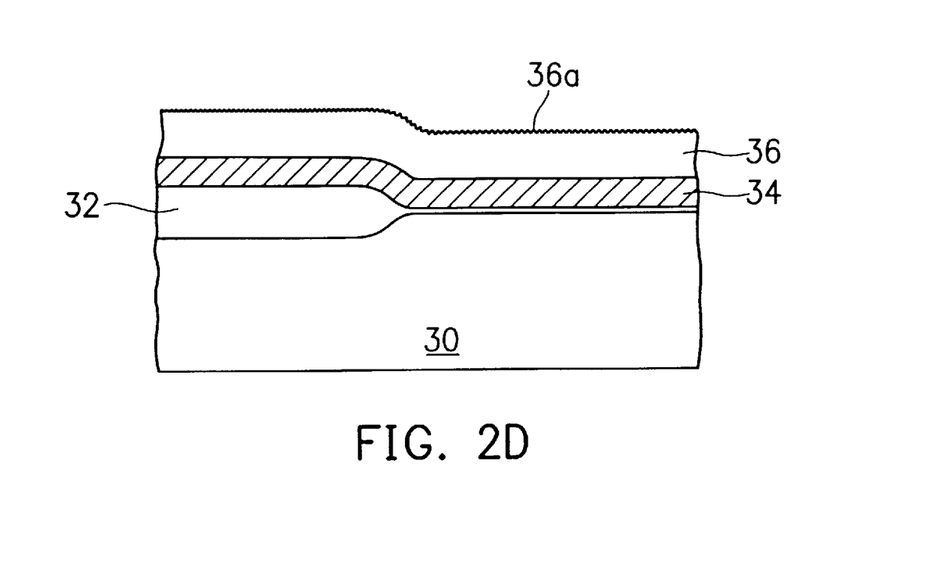

Referring next to FIG. 2D, using an etchant solution, a wet etching process is performed. Due to a greater penetrating rate for an etchant solution through the grain boundaries of the grains in the thin silicon nitride layer, the etching rate at the surface of the cap oxide layer just below the thin silicon nitride layer is different in different locations, and therefore generates an artificial micro-roughened surface structure 36a on the cap oxide layer. The etching process, for example, can use a 10:1 hydrogen fluoride etchant solution to etch for a period of about 1 to 3 minutes, or can use a 20:1 or a 6:1 buffered oxide etchant (BOE) solution as a substitute. Moreover, the method of forming the artificial micro-roughened surface on the cap insulating layer is not limited to the one described above. Any other suitable method for alternatively creating an artificial micro-roughened surface (for example, a plasma method), can be used, provided that some basic requirements are met.

Figure 2E:
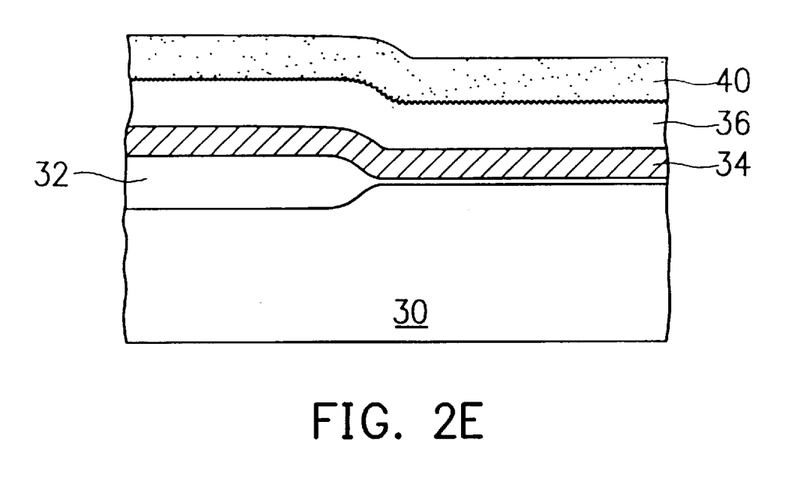
Figure 2F:
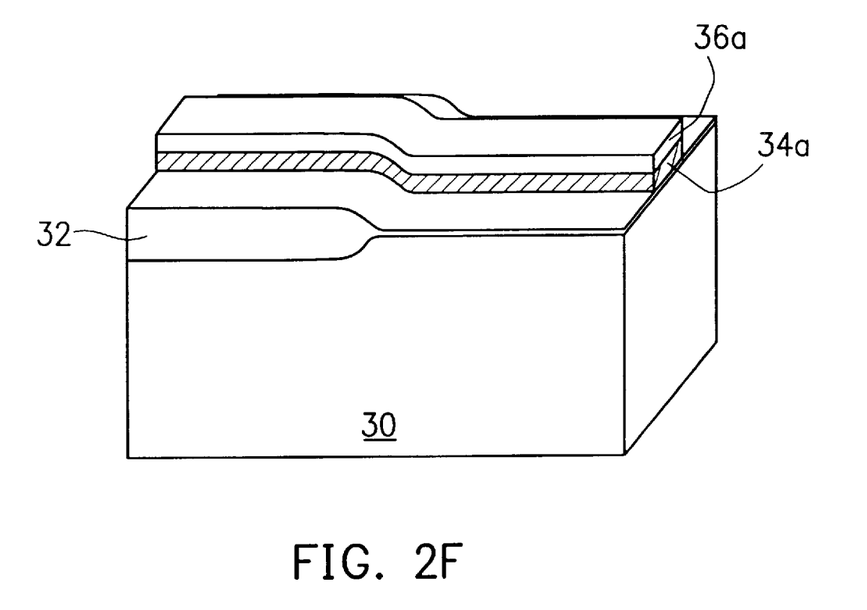
FIG. 2F is a perspective view showing the result of subsequent processing on the conductive polysilicon wire of FIG. 2E.
Figure 2G:
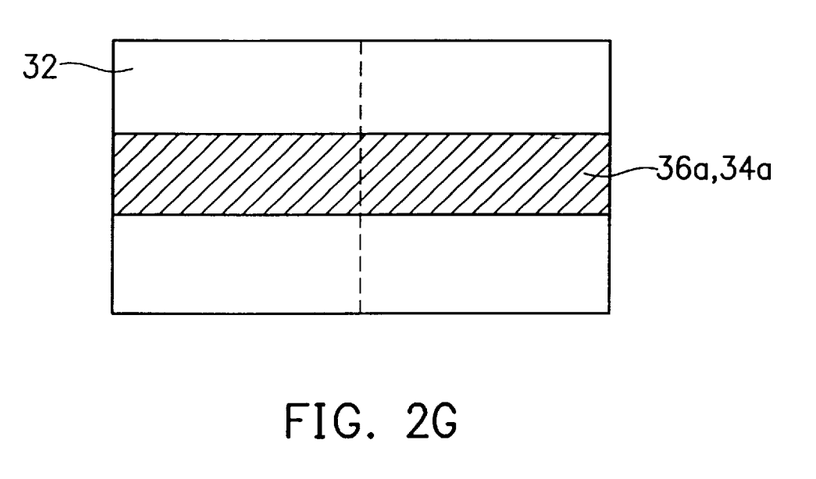
FIG. 2G is a top view of the structure shown in FIG. 2F.

Referring next to FIG. 2E, in the subsequent step a photoresist layer 40 is formed over the artificial micro-roughened surface of the cap oxide layer 36. Next, using a parallel light source that uses, for example, deep ultraviolet light, light is passed through a patterned mask to transfer the pattern to the photoresist layer 40. Then, a development process is performed to remove part of the photoresist layer 40. Subsequently, the cap oxide layer 36 and the polysilicon layer 34, in regions without photoresist coverage, are etched in sequence. Thereafter, the residual photoresist layer 40 and part of the cap oxide layer 36 are removed to form a double-layered composite structure of cap oxide material 36a and polysilicon conductive wire 34a (for example, as shown in FIGS. 2F and 2G).

As can be seen from the above description of the preferred embodiment of the invention, a main characteristic lies in the formation of an artificial micro-roughened surface on the cap oxide layer, which deflects incoming light rays in random directions, and creates an environment for the destructive interference of light rays that eliminates back reflection of light, and thereby prevents the bottlenecking effect which would otherwise make those portions of the polysilicon conductive wire above the field oxide layer peripheral regions cave in. Furthermore, the method not only can avoid the occurrence of pattern transfer errors due to reflection of ultraviolet light rays, but also can offer better processing repeatability without the unnecessary formation within impurity particles.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of manufacturing a polysilicon conductive wire, suitable for use in integrated circuits, comprising the steps of:

(a) forming a polysilicon layer above a semiconductor substrate having a preformed device;

(b) forming a cap insulating layer above the polysilicon layer;

(c) forming a roughened structure on a surface of the cap insulating layer by forming a silicon nitride layer over the cap insulating layer and wet etching the silicon nitride layer and the cap insulating layer in sequence, so that light incident on the surface is scattered by the roughened structure;

(d) after said step (c), coating a layer of photoresist over the roughened structure;

(e) transferring a pattern onto the photoresist layer by selective exposure of the photoresist layer to a light source, followed by removal of unexposed photoresist;

(f) after said step (e), etching the cap insulating layer and the polysilicon layer in sequence in regions not covered by the photoresist; and (g) removing residual photoresist layer to leave behind the polysilicon conductive wire.

2. A manufacturing method according to claim 1, wherein, after said step (g) a layer of cap insulating material remains above the polysilicon conductive wire.

3. A manufacturing method according to claim 1, wherein said step (a) includes forming the polysilicon layer to a thickness of between 1000 Å and 1500 Å.

4. A manufacturing method according to claim 1, wherein said step (b) includes forming the cap insulating layer as a cap oxide layer.

5. A manufacturing method according to claim 4, wherein said step (b) includes forming the cap insulating layer to a thickness of between 2500 Å and 3000 Å.

6. A manufacturing method according to claim 1, further comprising the step of forming a layer of metal silicide material above the polysilicon layer.

7. A manufacturing method according to claim 6, wherein said step of forming a layer of metal silicide material includes forming the layer of metal silicide material to a thickness of between 1500 Å and 1800 Å.

8. A manufacturing method according to claim 1, wherein said step of forming the silicon nitride layer includes forming the silicon nitride layer to a thickness of between 50 Å and 300 Å.

9. A manufacturing method according to claim 1, wherein said step of wet etching includes wet etching with a buffered oxide etchant solution.

10. A manufacturing method according to claim 9, wherein said step of wet etching includes immersion of the silicon nitride layer and the cap insulating layer in an etchant solution for between 3 and 6 minutes.

11. A manufacturing method according to claim 1, wherein said step of wet etching includes wet etching with a hydrogen floride etchant solution.

12. A manufacturing method according to claim 1, wherein said step (e) includes selective exposure of the photoresist to a source of deep ultraviolet light.

13. A method of manufacturing a polysilicon conductive wire suitable for use in integrated circuits, comprising of the steps of:

(a) forming a field oxide layer and a device on a semiconductor substrate;

(b) forming a polysilicon layer over the semiconductor substrate, the device and the field oxide layer;

(c) forming a cap oxide layer over the polysilicon layer;

(d) forming a silicon nitride layer over the cap oxide layer;

(e) wet-etching the cap oxide layer from a surface of the silicon nitride layer so as to form a roughened structure;

(f) after said step (e), coating a layer of photoresist on the roughened structure;

(g) transferring a pattern to the layer of photoresist by selective exposure of the layer of photoresist to light, and then removing unexposed photoresist;

(h) after said step (g), etching the cap oxide layer and the polysilicon layer in sequence in regions not covered by photoresist; and (i) after said step (h), removing residual photoresist to leave behind a polysilicon conductive wire.

14. A manufacturing method according to claim 13, wherein a layer of cap oxide material remains above the polysilicon conducting wire after said step (i).

15. A method of manufacturing a polysilicon conductive wire, suitable for use in integrated circuits, comprising the steps of:

(a) forming a polysilicon layer above a semiconductor substrate having a preformed device;

(b) forming a cap insulating layer above the polysilicon layer;

(c) increasing a roughness of a surface of the cap insulating layer;

(d) after said step (c), coating a layer of photoresist over the roughened surface;

(e) transferring a pattern onto the photoresist layer by selective exposure of the photoresist layer to a light source, followed by removal of unexposed photoresist;

(f) after said step (e), etching the cap insulating layer and the polysilicon layer in sequence in regions not covered by the photoresist; and (g) removing residual photoresist layer to leave behind the polysilicon conductive wire.

16. A manufacturing method according to claim 15, wherein, after said step (g) a layer of cap insulating material remains above the polysilicon conductive wire.

17. A manufacturing method according to claim 15, further comprising the step of forming a layer of metal silicide material above the polysilicon layer.

18. A manufacturing method according to claim 15, wherein said step (c), includes the steps of:

forming a silicon nitride layer over the cap insulating layer; and wet etching the silicon nitride layer and the cap insulating layer in sequence so as to increase the roughness of the surface of the cap insulating layer.

19. A manufacturing method according to claim 15, wherein said step (e) includes selective exposure of the photoresist to a source of deep ultraviolet light.

* * * * *